(12) United States Patent
Chen et al.

(10) Patent No.: US 12,237,618 B2
(45) Date of Patent: Feb. 25, 2025

(54) INTERFACE CARD ASSEMBLY AND CIRCUIT BOARD MODULE USING THE SAME

(71) Applicant: ASUSTeK COMPUTER INC., Taipei (TW)

(72) Inventors: Po-Ting Chen, Taipei (TW); Chang-Hung Chen, Taipei (TW); Chih-Hung Chuang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 427 days.

(21) Appl. No.: 17/834,947

(22) Filed: Jun. 8, 2022

(65) Prior Publication Data

US 2023/0072319 A1    Mar. 9, 2023

(30) Foreign Application Priority Data

Sep. 6, 2021 (TW) ................................. 110132981

(51) Int. Cl.
| | |
|---|---|
| *H01R 13/639* | (2006.01) |
| *H01R 12/73* | (2011.01) |
| *H05K 1/18* | (2006.01) |
| *H05K 7/20* | (2006.01) |

(52) U.S. Cl.
CPC .......... *H01R 13/639* (2013.01); *H01R 12/73* (2013.01); *H05K 1/18* (2013.01); *H05K 7/20509* (2013.01); *H05K 2201/09063* (2013.01); *H05K 2201/10189* (2013.01); *H05K 2201/10409* (2013.01); *H05K 2201/2036* (2013.01)

(58) Field of Classification Search
CPC ................. H05K 1/0209; H05K 1/144; H05K 2201/042; H05K 1/141; H05K 2201/2036; H05K 2201/10409; H05K 2201/10189; H05K 2201/09063; H05K 7/20509; H05K 1/18; G06F 1/185; H01R 12/73
See application file for complete search history.

(56) References Cited

U.S. PATENT DOCUMENTS

2008/0024993 A1* 1/2008 Chu ................ H01L 23/4093
257/E23.102

FOREIGN PATENT DOCUMENTS

| CN | 2814907 | 9/2006 | | |
|---|---|---|---|---|
| CN | 111653298 | 9/2020 | | |
| CN | 111800989 A | * 10/2020 | | |
| DE | 202018107272 U1 | * 4/2019 | ............... | G06F 1/20 |
| FR | 2966318 A1 | * 4/2012 | ............... | G06F 1/20 |

* cited by examiner

*Primary Examiner* — Jean F Duverne
(74) *Attorney, Agent, or Firm* — JCIPRNET (57) ABSTRACT

An interface card assembly adapted for fixing an M.2 interface card to a circuit board body with an M.2 connector is provided. The M.2 interface card includes a connecting end and an end. The interface card assembly includes a heat dissipation plate and a fastener. The heat dissipation plate is disposed at a position adjacent to the M.2 connector, and the heat dissipation plate includes a hole. The fastener is detachably disposed in the hole. The fastener includes a main body and a cantilever, and a clamping part is disposed between the main body and the cantilever. When the M.2 interface card is inserted into the M.2 connector through the connecting end, the fastener moves relative to the heat dissipation plate at the end, so that the M.2 interface card extends into the clamping part and is clamped between the main body and the cantilever.

9 Claims, 10 Drawing Sheets

INTERFACE CARD ASSEMBLY AND CIRCUIT BOARD MODULE USING THE SAME

CROSS-REFERENCE TO RELATED APPLICATION

This application claims the priority benefit of Taiwan application serial no. 110132981, filed on Sep. 6, 2021. The entirety of the above-mentioned patent application is hereby incorporated by reference herein and made a part of this specification.

BACKGROUND

Technical Field

The disclosure relates to an interface card assembly and a circuit board module, and particularly to an interface card assembly and a circuit board module adapted for fixing an M.2 interface card.

Description of Related Art

At present, the main method of fixing the M.2 interface card on the motherboard is screw fastening. However, this requires the use of tools for disassembly and assembly, which is inconvenient and does not allow quick replacement. In addition, if the screws are accidentally lost during assembly, it can also cause trouble.

SUMMARY

The disclosure provides an interface card assembly adapted for fixing an M.2 interface card to a circuit board body with an M.2 connector. The M.2 interface card includes a connecting end and an end. The interface card assembly includes a heat dissipation plate and a fastener. The heat dissipation plate is disposed at a position adjacent to the M.2 connector, and the heat dissipation plate includes a hole. The fastener is detachably disposed in the hole. The fastener includes a main body and a cantilever, and a clamping part is disposed between the main body and the cantilever. When the M.2 interface card is inserted into the M.2 connector through the connecting end, the fastener moves relative to the heat dissipation plate at the end, so that the M.2 interface card extends into the clamping part and is clamped between the main body and the cantilever.

The disclosure provides a circuit board module adapted for fixing an M.2 interface card. The M.2 interface card includes a connecting end and an end. The circuit board module includes a circuit board body and the above-described interface card assembly. The heat dissipation plate corresponds to the M.2 connector and is disposed above the circuit board body.

In summary, in the disclosure, the M.2 interface card is fixed to the heat dissipation plate through a fastener. The fastener moves relative to the heat dissipation plate, so that the M.2 interface card is clamped between the main body and the cantilever. Therefore, the user operates the fastener with bare hands to complete the fastening, saving the time of using tools.

DESCRIPTION OF THE EMBODIMENTS

Figure 1:
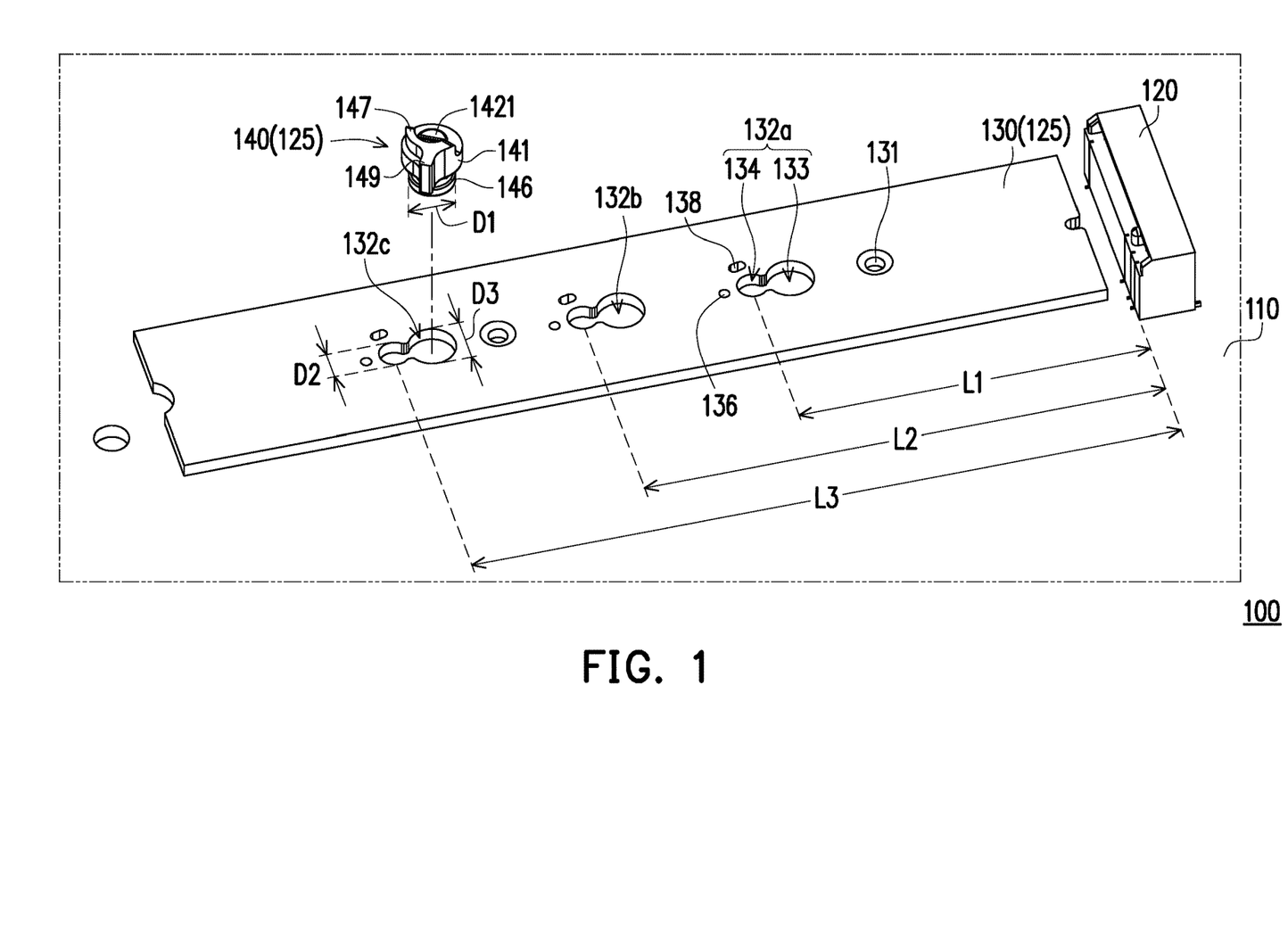
FIG. 1 is a partial three-dimensional schematic view of a circuit board module according to an embodiment of the disclosure.
Figure 2:
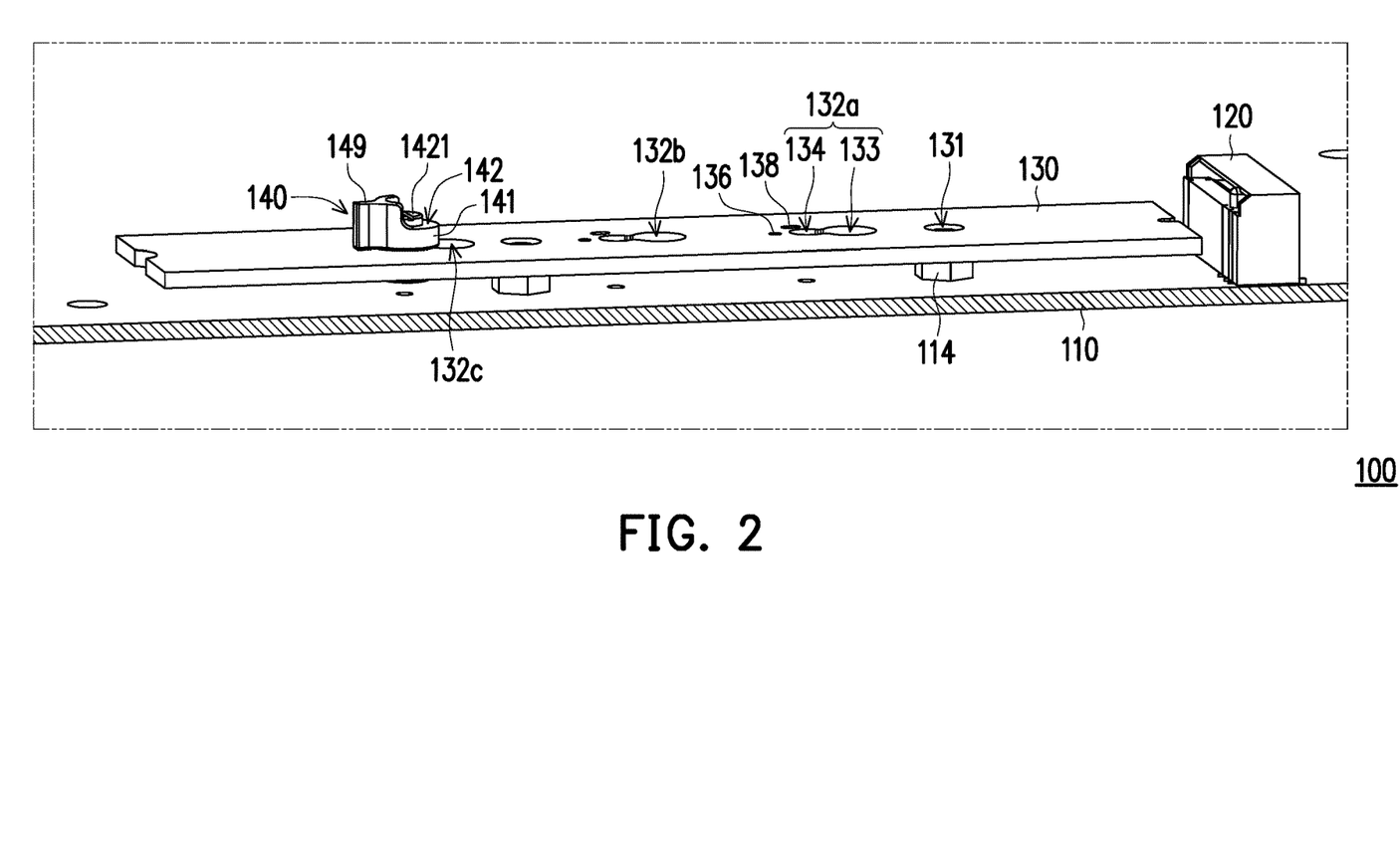
FIG. 2 is a partial three-dimensional schematic view of FIG. 1 from another perspective.
Figure 3:
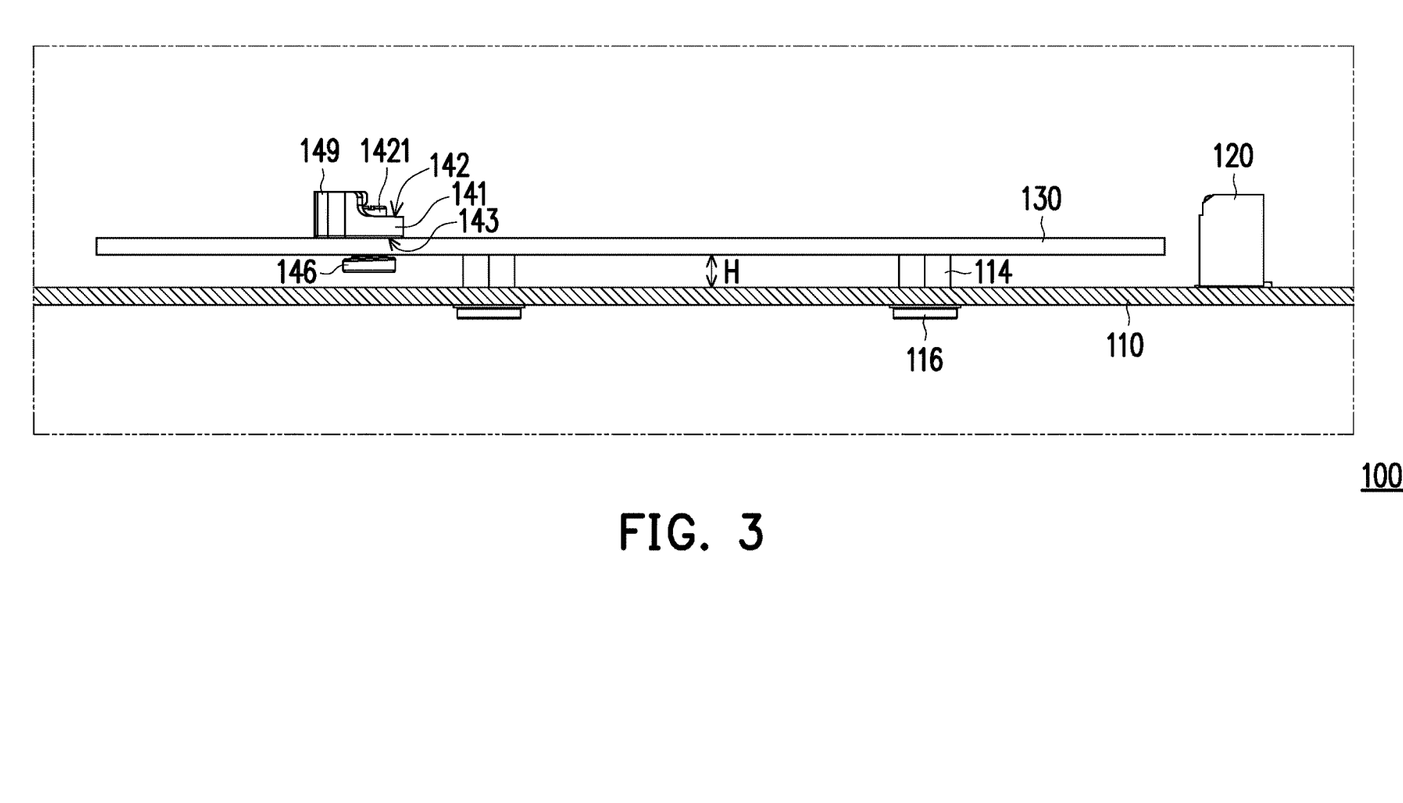
FIG. 3 is a side view of FIG. 2.

Please refer to FIG. 1 to FIG. 3. The disclosure provides an interface card assembly 125 configured for fixing an M.2 interface card 10 to a circuit board body 110 with an M.2 connector 120. The interface card assembly 125 of the disclosure includes a heat dissipation plate 130 and a fastener 140.

Figure 10:
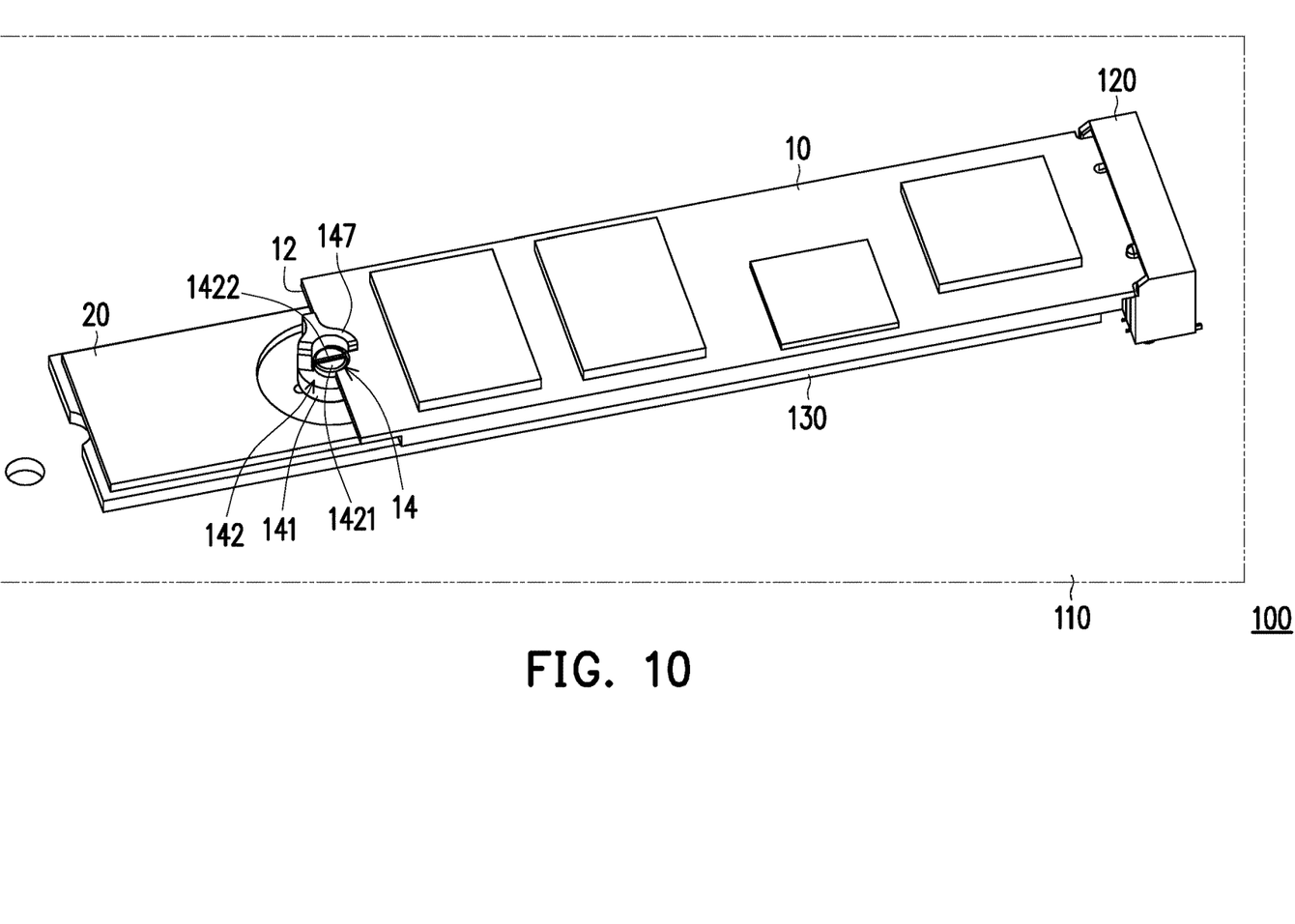
FIG. 10 is a three-dimensional schematic view of the M.2 interface card being fixed by the fastener of the circuit board module of FIG. 1.

Please refer to FIG. 10. The disclosure further provides a circuit board module 100 configured for the M.2 interface card 10 to be inserted. The circuit board module 100 of the disclosure includes a circuit board body 110 and an interface card assembly 125. Because the interface card assembly 125 included in the circuit board module 100 is the same as the above-described one, it will be described together below.

In an embodiment, the M.2 interface card 10 is, for example, an M.2 SSD.

In an embodiment, the circuit board body 110 is, for example, a motherboard, and the M.2 interface card 10 is connected to the circuit board body 110 through the M.2 connector 120 inserted in the circuit board body 110.

The heat dissipation plate 130 is optionally fixed to the circuit board body 110. In an embodiment, the position of the heat dissipation plate 130 is located adjacent to the M.2 connector.

In an embodiment, the heat dissipation plate 130 is disposed on a bottom surface of the M.2 interface card 10 (as shown in FIG. 10). In other words, the heat dissipation plate 130 is located between the circuit board body 110 and the M.2 interface card 10, thereby enhancing the heat dissipation effect of the M.2 interface card 10 on the bottom surface.

As shown in FIG. 2 and FIG. 3, in an embodiment, there is a distance H (FIG. 3) between the heat dissipation plate 130 and the circuit board body 110, so that there is a gap between the heat dissipation plate and the circuit board body 110 to prevent the heat dissipation plate 130 from directly contacting the circuit board body 110. In this way, the gap between the heat dissipation plate 130 and the circuit board body 110 can allow air to pass through, which improves the heat dissipation effect of the heat dissipation plate 130 and prevents the heat transferred from the M.2 interface card 10 to the heat dissipation plate 130 from being transferred to the circuit board body 110 and increasing the temperature of the circuit board body 110.

In an embodiment, a spacer 114 is provided between the heat dissipation plate 130 and the circuit board body 110 to maintain the distance H between the heat dissipation plate 130 and the circuit board body 110, but the way in which the heat dissipation plate 130 is spaced from the circuit board body 110 is not limited thereto.

In an embodiment, the heat dissipation plate 130 includes a fixing hole 131 (FIG. 2, for example, a screw hole), and a locking member 116 (FIG. 3) penetrates the circuit board body 110 and the spacer 114 is fastened to the fixing hole 131, so that the relative position of the heat dissipation plate and the circuit board body 110 is fixed. Of course, in other embodiments, the heat dissipation plate 130 is fixed to the circuit board body 110 by other methods such as clamping or riveting, and the disclosure is not limited thereto.

As shown in FIG. 1, the heat dissipation plate 130 includes at least one hole 132a, 132b and 132c. For example, the heat dissipation plate 130 includes a plurality of holes 132a, 132b and 132c. The positions of the holes 132a, 132b, and 132c correspond to the M.2 interface card 10 with different lengths.

In an embodiment, the holes include at least three holes 132a, 132b and 132c. The three holes 132a, 132b and 132c and the M.2 connector 120 respectively form three distances L1, L2 and L3, and the distances are, for example, about 42 mm, 60 mm and 80 mm, respectively.

In an embodiment, the distances L1, L2 and L3 correspond to the lengths of the M.2 interface card 10 that are common today. In the disclosure, the number of holes 132a, 132b and 132c and the distances from the M.2 connector 120 are not limited to the above.

In an embodiment, each hole 132a, 132b and 132c is gourd shaped, and each hole 132a, 132b and 132c includes a large hole part 133 and a small hole part 134 connected to each other. The large hole part 133 is closer to the M.2 connector 120, and the small hole part 134 is farther away from the M.2 connector 120.

In the above embodiment, the distances L1, L2 and L3 between the three holes 132a, 132b and 132c and the M.2 connector 120 mainly refer to the distances from the center of the three small hole parts 134 to the M.2 connector 120.

In other embodiments, the large hole part 133 is farther away from the M.2 connector 120, and the small hole part 134 is closer to the M.2 connector 120; that is, the holes 132a, 132b and 132c shown in FIG. 1 are flipped horizontally, and the distances between the three holes and the M.2 connector 120 still refer to the distances from the center of the small hole parts 134 to the M.2 connector 120.

In an embodiment, the heat dissipation plate 130 includes a first positioning hole 136 and a second positioning hole 138 located beside each small hole part 134. The first positioning hole 136 is, for example, a long ellipse, and the second positioning hole 138 is, for example, a circle, but the shapes of the first positioning hole 136 and the second positioning hole 138 are not limited thereto.

The fastener 140 is detachably disposed in one of the holes 132a, 132b and 132c. The fastener 140 is configured to fix the M.2 interface card 10 to the heat dissipation plate 130.

In an embodiment, the fastener 140 is exemplified as a rotary fastener, but the disclosure is not limited thereto, and the fastener is in other forms, such as a bolt fastener, a rivet fastener, or a buckle fastener, and the M.2 interface card 10 is clamped by moving the fastener.

In an embodiment, the disposition position of the fastener 140 varies according to the length of the M.2 interface card 10. For example, if the length of the M.2 interface card 10 is 42 mm, the fastener 140 is disposed in the hole 132a closest to the M.2 connector 120. If the length of the M.2 interface card 10 is 60 mm, the fastener 140 is disposed in the hole 132b second closest to the M.2 connector 120. If the length of the M.2 interface card 10 is 80 mm, the fastener 140 is disposed in the hole 132c farthest from the M.2 connector 120.

Figure 4:
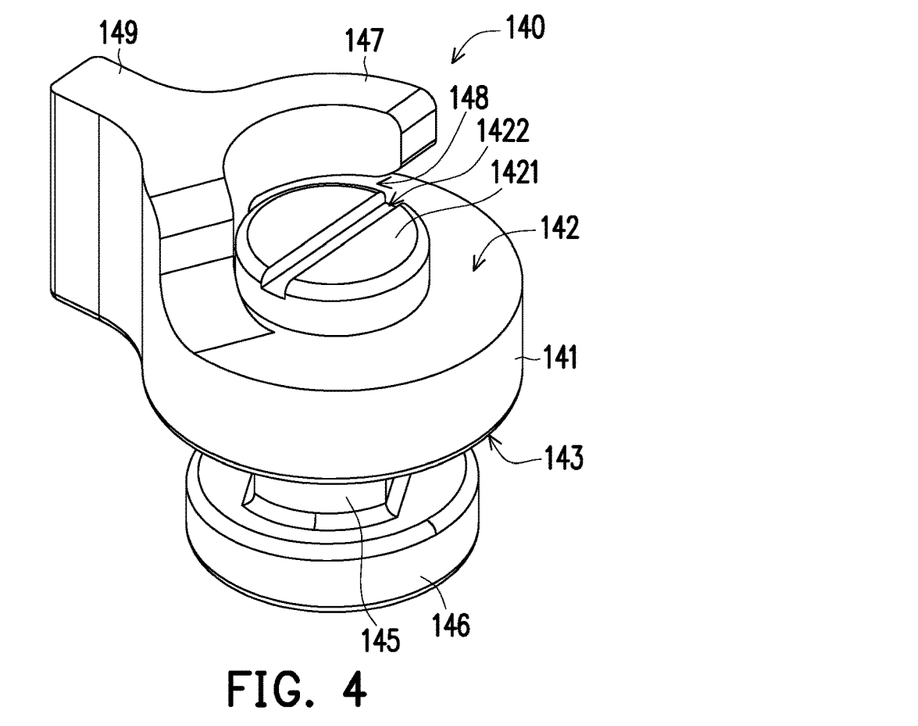
FIG. 4 to FIG. 6 are three-dimensional schematic views of the fastener of the circuit board module of FIG. 1 from various perspectives.
Figure 5:
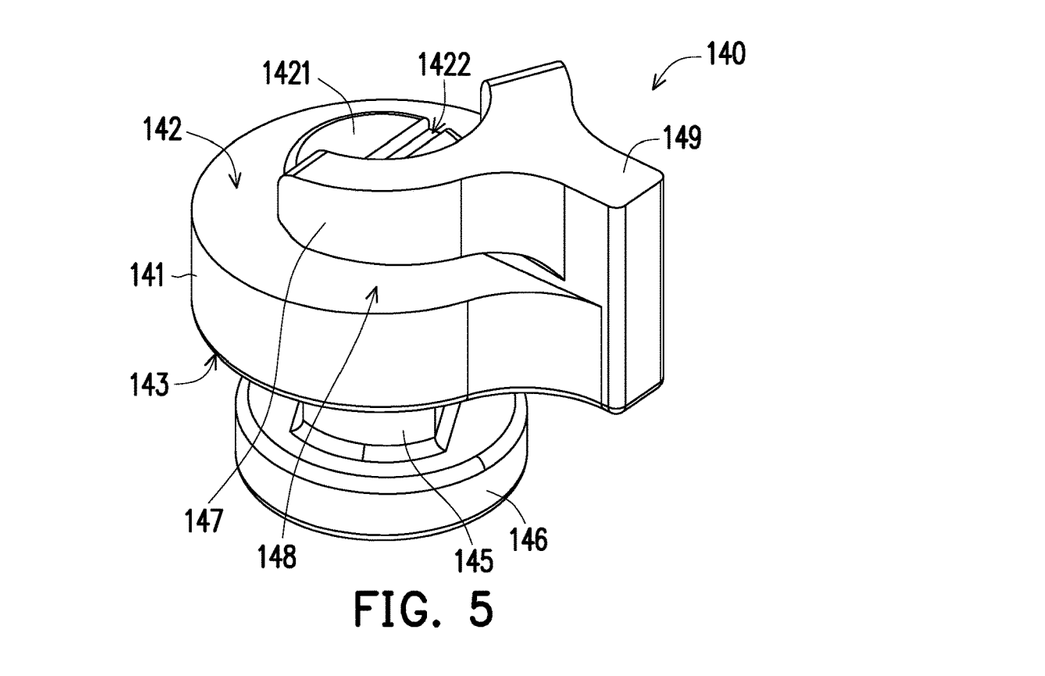
Figure 6:
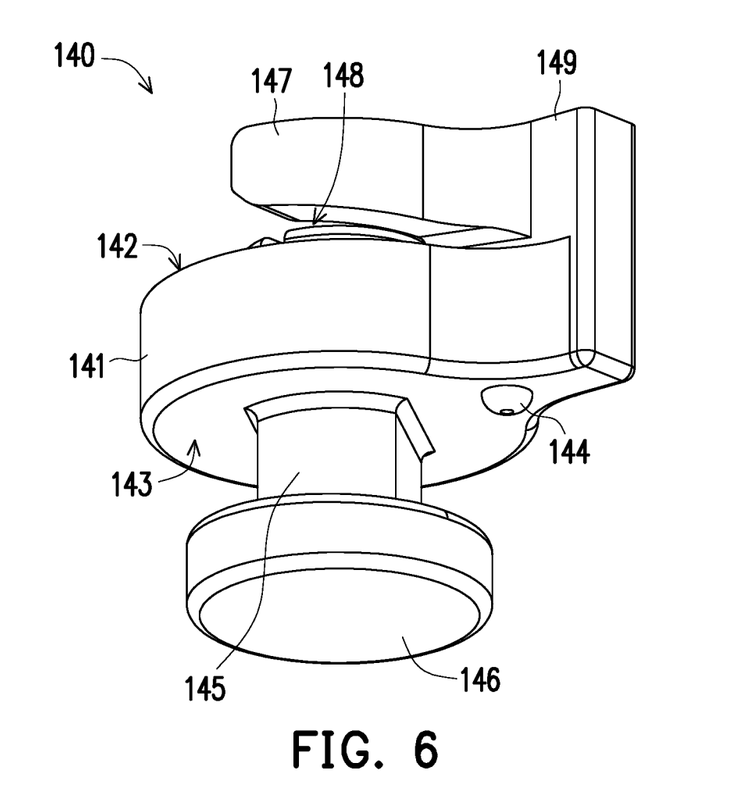

FIG. 4 to FIG. 6 are three-dimensional schematic views of the fastener of the circuit board module of FIG. 1 from various perspectives. Please refer to FIG. 4 to FIG. 6. In this embodiment, the fastener 140 includes a main body 141 and a cantilever 147, and a clamping part 148 is disposed between the main body 141 and the cantilever 147.

The main body 141 includes a first surface 142 and a second surface 143 opposite to each other, and the cantilever 147 is located on the first surface 142. The fastener 140 further includes a circular protrusion 1421 protruding from the first surface 142, and the circular protrusion 1421 is provided with an indicator 1422. The indicator 1422 is, for example, an I-shaped notch or a mark on the circular protrusion 1421, and the shape of the indicator 1422 is not limited by the drawing.

The fastener 140 further includes a necked section 145 protruding from the second surface 143 and a stop part 146 connected to the necked section 145. It is seen from FIG. 6 that the diameter of the main body 141 is larger than the diameter of the stop part 146, and the diameter of the stop part 146 is larger than the maximum width of the necked section 145. In addition, the main body 141 further includes a positioning pillar 144 protruding from the second surface 143.

As shown in FIG. 3, in this embodiment, the second surface 143 of the main body 141 faces the heat dissipation plate 130. When the fastener 140 is disposed on the heat dissipation plate 130, the necked section 145 (FIG. 6) is located in the hole 132c (FIG. 2), and the stop part 146 is located between the heat dissipation plate 130 and the circuit board body 110.

It is seen from FIG. 1 that a diameter D1 of the stop part 146 is larger than a diameter D2 of the small hole part 134 and smaller than a diameter D3 of the large hole part 133.

The stop part 146 of the fastener 140 passes through the large hole part 133, so that the necked section 145 is located in the hole 132c. In addition, after the fastener 140 moves from the large hole part 133 to the small hole part 134, since the diameter D1 of the stop part 146 located under the heat dissipation plate 130 is larger than the diameter D2 of the small hole part 134, the fastener 140 will not directly move upward through the small hole 134 away from the heat dissipation plate 130 and fall away.

In addition, since the size (diameter) of the main body 141 of the fastener 140 is larger than the diameter D3 of the large hole part 133 and the diameter D2 of the small hole part 134, when the fastener 140 is disposed on the heat dissipation plate 130, the main body 141 is supported by the heat dissipation plate 130 without moving downward through the large hole part 133 or the small hole part 134 away from the heat dissipation plate 130.

Figure 7A:
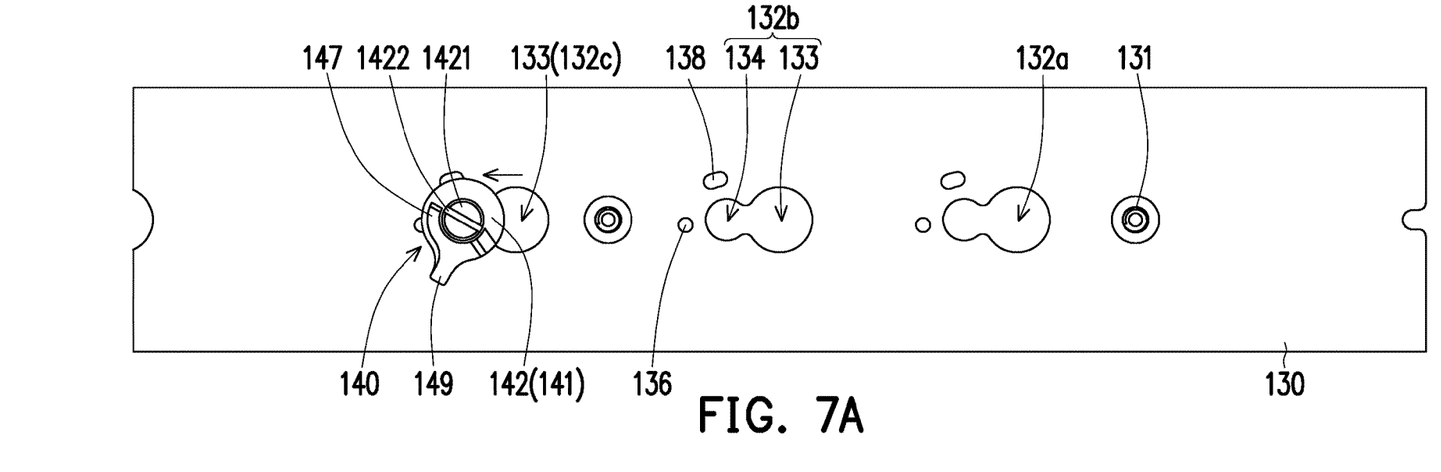
FIG. 7A, FIG. 8A, and FIG. 9A are schematic top views showing the rotation process of the fastener of the circuit board module of FIG. 1.
Figure 7B:
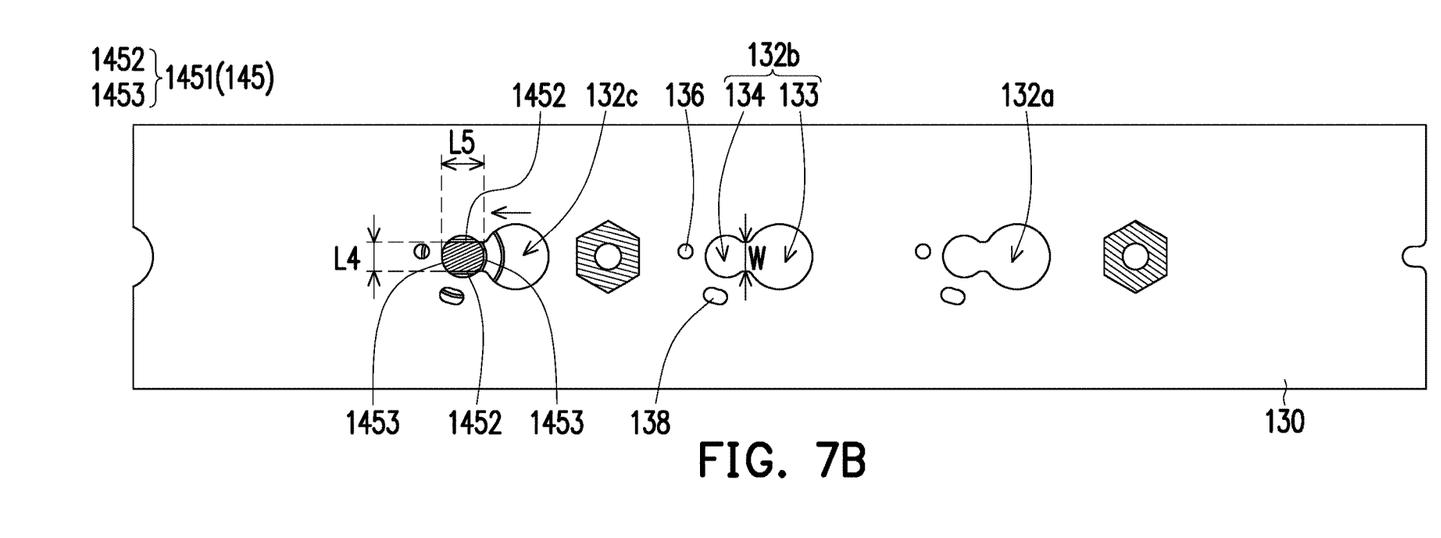
FIG. 7B, FIG. 8B, and FIG. 9B are cross-sectional schematic views of the necked section of the circuit board module of FIG. 1 during the rotation process.
Figure 8A:
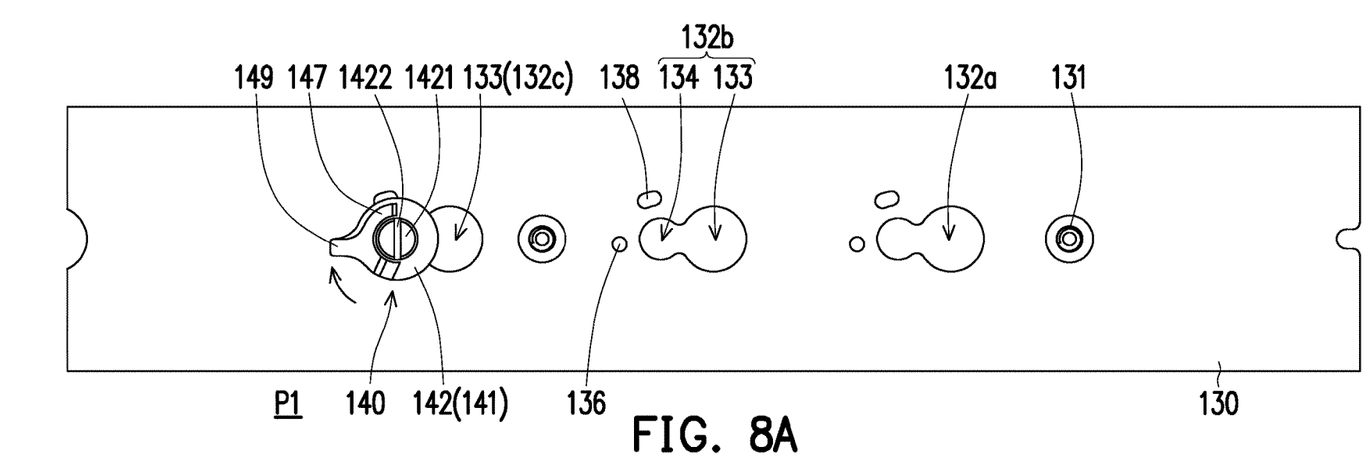
Figure 8B:
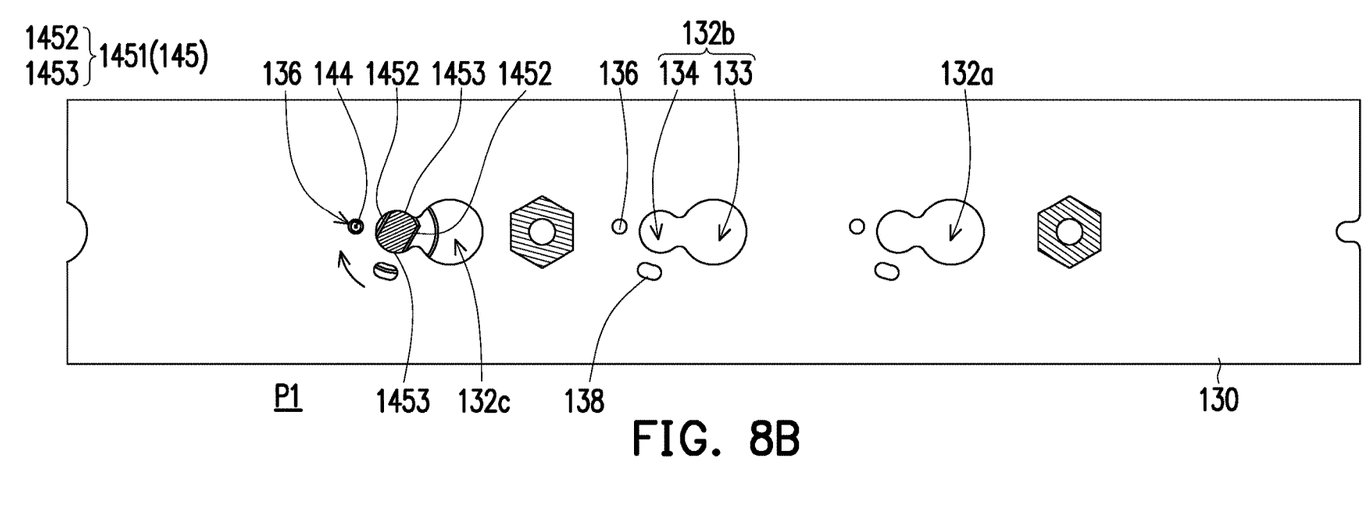
Figure 9A:
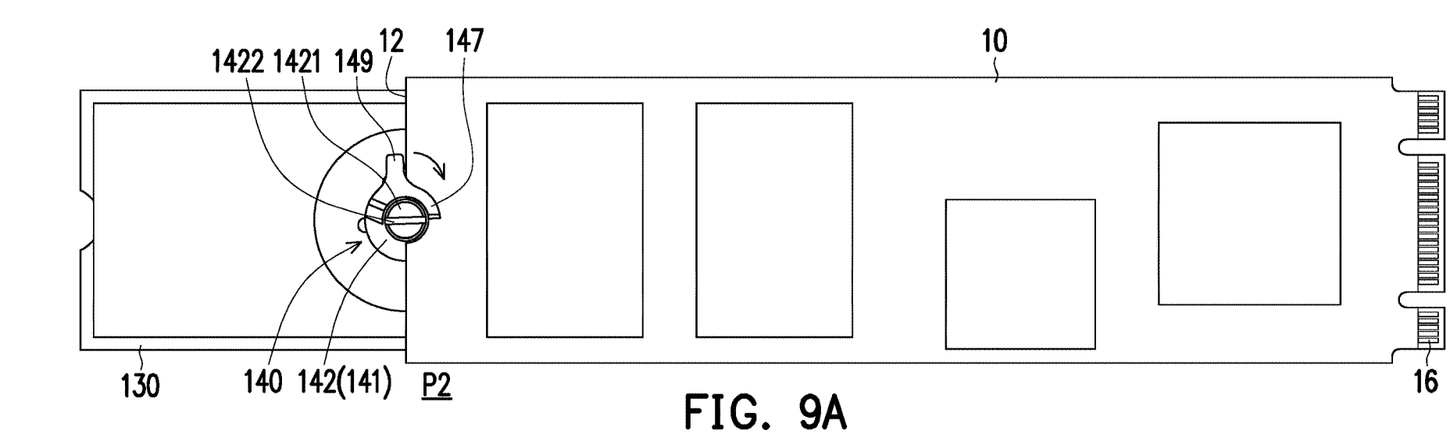
Figure 9B:
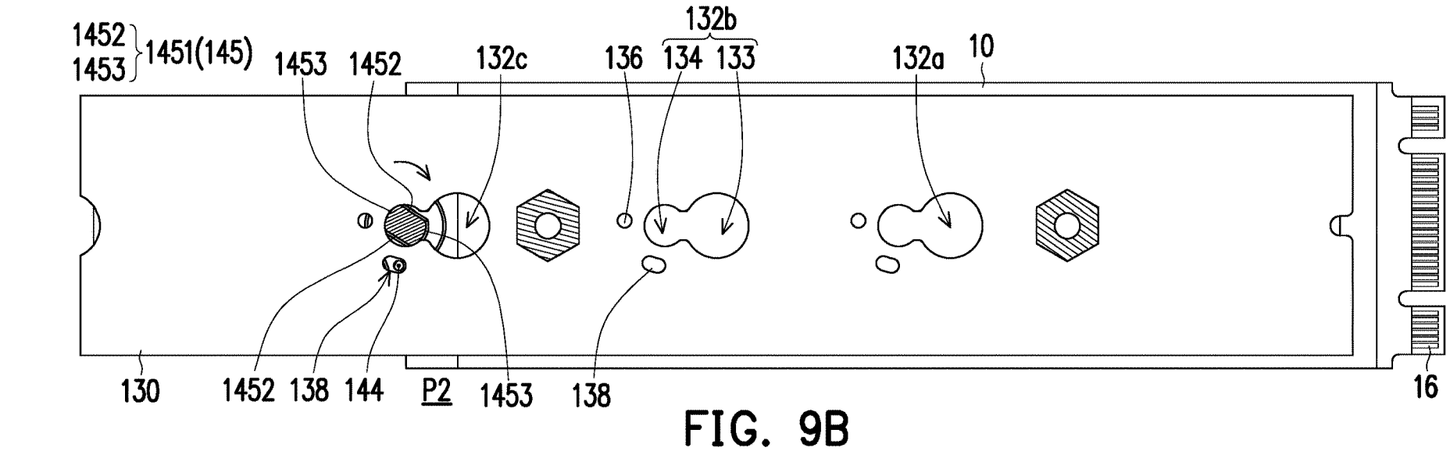

FIG. 7A, FIG. 8A, and FIG. 9A are schematic top views showing the rotation process of the fastener of the circuit board module of FIG. 1. FIG. 7B, FIG. 8B, and FIG. 9B are cross-sectional schematic views of the necked section of the circuit board module of FIG. 1 during the rotation process. In FIG. 7A to FIG. 9B, the M.2 connector 120 is not shown. In addition, although an example is described in which the fastener 140 is disposed in the hole 132c on the leftmost side of the heat dissipation plate 130, the operation method is the same for the fasteners 140 disposed in the other holes 132a and 132b of the heat dissipation plate 130, so the description will not be repeated.

In FIG. 7A and FIG. 7B, the fastener 140 moves from the large hole part 133 to the small hole part 134. It is seen from FIG. 7B that a cross section 1451 of the necked section 145 of the fastener 140 includes two parallel straight sides 1452 and two arc sides 1453 connected to the two straight sides 1452. A distance L4 between the two straight sides 1452 is smaller than a width W at the junction of the large hole part 133 and the small hole part 134, and a maximum distance L5 between the two arc sides 1453 is larger than the width W.

Therefore, if the fastener 140 is to move from the large hole part 133 to the small hole part 134, the necked section 145 needs to be rotated to a state where the two straight sides 1452 are parallel to the long side of the heat dissipation plate 130, and then the fastener 140 moves from the large hole part 133 to the small hole part 134 through the junction of the large hole part 133 and the small hole part 134. As shown in FIG. 7A, at this time, a handle 149 of the fastener 140 will point to the lower left of the small hole part 134.

Next, please refer to FIG. 8A. The handle 149 of the fastener 140 is rotated so that the fastener 140 is located at a first position P1 relative to the heat dissipation plate 130. At this time, the indicator 1422 of the circular protrusion 1421 is parallel to the short side of the heat dissipation plate 130, for example.

In this embodiment, since the end of the cantilever 147 of the fastener 140 extends close to the indicator 1422, after the cantilever 147 of the fastener 140 is rotated clockwise in FIG. 8A, with reference to FIG. 9A and FIG. 10, at this time, the user inserts the M.2 interface card 10 into the M.2 connector 120 through a connecting end 16, and the circular protrusion 1421 of the fastener 140 is located in a semicircular hole 14 of an end 12 of the M.2 interface card 10. In addition, the end 12 of the M.2 interface card 10 will lean against the right half of the first surface 142 of the main body 141 of the fastener 140. In other words, if the M.2 interface card 10 is inserted into the M.2 connector 120 at this time, the cantilever 147 of the fastener 140 will not interfere with the M.2 interface card 10.

Please refer to FIG. 8B. When the fastener 140 is located at the first position P1 relative to the heat dissipation plate 130, the positioning pillar 144 of the fastener 140 extends into the first positioning hole 136 of the heat dissipation plate 130, so that the fastener 140 is temporarily fixed to the heat dissipation plate 130.

Please refer to FIG. 9A. The handle 149 of the fastener 140 is rotated so that the fastener 140 is located at a second position P2 relative to the heat dissipation plate 130. At this time, the cantilever 147 of the fastener 140 is rotated to above the end 12 of the M.2 interface card 10 to restrict the M.2 interface card 10 from moving upward. Therefore, the M.2 interface card 10 is restricted on the heat dissipation plate 130 by the fastener 140.

As shown in FIG. 9B, when the fastener 140 is located at the second position P2 relative to the heat dissipation plate 130, the positioning pillar 144 of the fastener 140 extends into the second positioning hole 138 of the heat dissipation plate 130. Such a design prevents the fastener 140 from moving away from the second position easily, so that the M.2 interface card 10 is stably restricted on the heat dissipation plate 130 by the fastener 140.

Please refer to FIG. 6 and FIG. 10. The clamping part 148 is configured to press against the end 12 of the M.2 interface card 10. In an embodiment, a thermally conductive adhesive layer 20 is disposed between the heat dissipation plate 130 and the M.2 interface card 10. However, in other embodiments, the M.2 interface card 10 directly contacts the heat dissipation plate 130, and the thermally conductive adhesive layer 20 is omitted.

Please refer to FIG. 8A, FIG. 9A and FIG. 10 together. When the fastener 140 is rotated from the first position P1 (as shown in FIG. 8A) to the second position (as shown in FIG. 9A and FIG. 10) relative to the heat dissipation plate 130, the cantilever 147 of the fastener 140 is rotated to above the end 12 of the M.2 interface card 10, so that the M.2 interface card 10 extends into the clamping part 148 (FIG. 5) between the main body 141 and the cantilever 147 and is clamped between the main body 141 and cantilever 147. Therefore, the user can rotate the fastener with bare hands to complete the fastening, saving the time of using tools to complete the fastening.

Figure 11:
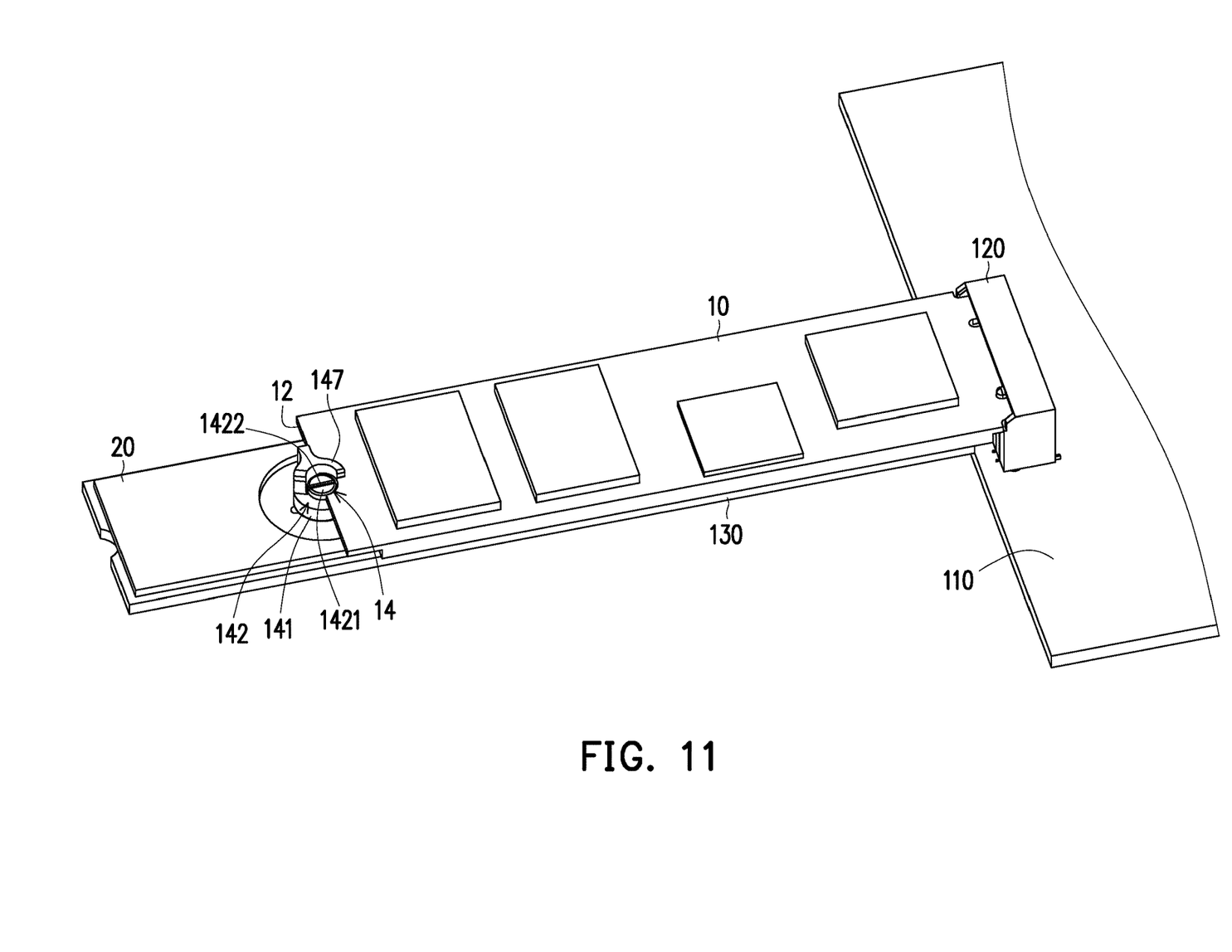
FIG. 11 is a three-dimensional schematic view of the M.2 interface card being fixed by the fastener of the interface card assembly of the disclosure.

Please refer to FIG. 11. In an embodiment, if the M.2 interface card 10 is inserted in the M.2 connector 120 at the edge of the circuit board body 110, and the M.2 interface card 10 is located outside the circuit board body 110, then the heat dissipation plate 130 is also correspondingly disposed outside the circuit board body 110, and the M.2 interface card 10 is fixed to the heat dissipation plate 130 through the fastener 140.

In summary, the disclosure provides a good heat dissipation effect for the M.2 interface card through the heat dissipation plate between the M.2 interface card and the circuit board body; in addition, in the disclosure, the fastener moves relative to the heat dissipation plate, so that the M.2 interface card is clamped between the main body and the cantilever. Therefore, the user operates the fastener with bare hands to complete the fastening, which is convenient and time-saving.

What is claimed is:

1. An interface card assembly, adapted for fixing an M.2 interface card to a circuit board body with an M.2 connector, the M.2 interface card having a connecting end and an end, the interface card assembly comprising:
    a heat dissipation plate, disposed at a position adjacent to the M.2 connector, wherein the heat dissipation plate comprises a hole; and
    a fastener, detachably disposed in the hole, wherein the fastener comprises a main body and a cantilever, and a clamping part is disposed between the main body and the cantilever,
    wherein when the M.2 interface card is inserted into the M.2 connector through the connecting end, the fastener moves relative to the heat dissipation plate at the end, so that the M.2 interface card extends into the clamping part and is clamped between the main body and the cantilever,
    wherein the main body comprises a first surface and a second surface opposite to each other,
    the cantilever is located on the first surface,
    the fastener further comprises a necked section protruding from the second surface and a stop part connected to the necked section,
    the necked section is located in the hole, and
    the stop part is located between the heat dissipation plate and the circuit board body.

2. The interface card assembly according to claim 1, wherein
    a diameter of the stop part is larger than a maximum width of the necked section.

3. The interface card assembly according to claim 2, wherein the hole is gourd shaped and comprises a large hole part and a small hole part connected to each other, and the diameter of the stop part is larger than a diameter of the small hole part and smaller than a diameter of the large hole part.

4. The interface card assembly according to claim 1, wherein the second surface faces the heat dissipation plate, the heat dissipation plate comprises a first positioning hole, the main body comprises a positioning pillar protruding from the second surface, and when the fastener is located at a first position relative to the heat dissipation plate, the positioning pillar extends into the first positioning hole.

5. The interface card assembly according to claim 4, wherein the heat dissipation plate comprises a second positioning hole, and when the fastener is located at a second position relative to the heat dissipation plate, the positioning pillar extends into the second positioning hole.

6. The interface card assembly according to claim 1, wherein the second surface faces the heat dissipation plate, and the fastener further comprises a circular protrusion protruding from the first surface.

7. The interface card assembly according to claim 6, wherein the circular protrusion is provided with an indicator.

8. A circuit board module adapted for fixing an M.2 interface card, the M.2 interface card having a connecting end and an end, the circuit board module comprising:

a circuit board body, comprising an M.2 connector; and an interface card assembly, comprising:

a heat dissipation plate, disposed at a position adjacent to the M.2 connector, wherein the heat dissipation plate comprises a hole; and a fastener, detachably disposed in the hole, wherein the fastener comprises a main body and a cantilever, and a clamping part is disposed between the main body and the cantilever, wherein when the M.2 interface card is inserted into the M.2 connector through the connecting end, the fastener moves relative to the heat dissipation plate at the end, so that the M.2 interface card extends into the clamping part and is clamped between the main body and the cantilever, wherein the main body comprises a first surface and a second surface opposite to each other, the cantilever is located on the first surface, the fastener further comprises a necked section protruding from the second surface and a stop part connected to the necked section, the necked section is located in the hole, and the stop part is located between the heat dissipation plate and the circuit board body.

9. The circuit board module according to claim 8, wherein the heat dissipation plate is fixed above the circuit board body through a locking member.

\* \* \* \* \*